United States Patent
Snai et al.

(10) Patent No.: US 10,164,591 B1
(45) Date of Patent: Dec. 25, 2018

(54) DIFFERENTIAL AMPLIFIER WITH COMMON-MODE BIASING TECHNIQUE

(71) Applicant: QUALCOMM Incorporated, San Diego, CA (US)

(72) Inventors: Makar Snai, Burdwan (IN); Tonmoy Biswas, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/684,034

(22) Filed: Aug. 23, 2017

(51) Int. Cl.
    *H03F 3/45* (2006.01)
    *H04B 1/40* (2015.01)
    *H04W 88/08* (2009.01)
    *H04W 88/02* (2009.01)

(52) U.S. Cl.
    CPC ..... *H03F 3/45636* (2013.01); *H03F 3/45183* (2013.01); *H04B 1/40* (2013.01); *H03F 2203/45082* (2013.01); *H03F 2203/45292* (2013.01); *H04W 88/02* (2013.01); *H04W 88/08* (2013.01)

(58) Field of Classification Search
    CPC .......................................................... H03F 3/45
    USPC ................................. 330/253, 257, 260, 261
    See application file for complete search history.

(56) References Cited

U.S. PATENT DOCUMENTS

| | | | |
|---|---|---|---|
| 5,955,922 A | 9/1999 | Nicollini et al. | |
| 6,121,836 A | 9/2000 | Vallencourt | |
| 7,042,432 B2 * | 5/2006 | Yamazaki | G09G 3/3688 257/59 |
| 7,248,104 B2 * | 7/2007 | Wang | H03F 3/45753 330/253 |
| 7,279,974 B2 * | 10/2007 | Rowley | H03F 3/45183 330/253 |
| 7,358,946 B2 | 4/2008 | Kokubun et al. | |
| 7,375,585 B2 | 5/2008 | Trifonov et al. | |
| 7,592,867 B2 | 9/2009 | Trifonov et al. | |
| 2012/0127138 A1 * | 5/2012 | Tsuchi | H03F 1/0261 345/204 |
| 2012/0133438 A1 * | 5/2012 | Tsuchi | H03F 3/45219 330/257 |

\* cited by examiner

*Primary Examiner* — Henry Choe
(74) *Attorney, Agent, or Firm* — Patterson & Sheridan, L.L.P.

(57) ABSTRACT

Certain aspects of the present disclosure provide methods and apparatus for amplifying signals with an amplification circuit and improving a common-mode rejection ratio (CMRR) thereof. The amplification circuit generally includes a differential amplifier comprising a first pair of transistors and a second pair of transistors coupled to the first pair of transistors, where the gates of the first pair of transistors are coupled to respective differential input nodes. The amplification circuit also includes an auxiliary amplifier comprising a third pair of transistors corresponding to the first pair of transistors and a fourth pair of transistors corresponding to the second pair of transistors, where drains of the third and fourth pairs of transistors are coupled together and to gates of the second pair of transistors and where gates of the fourth pair of transistors are coupled together.

20 Claims, 8 Drawing Sheets

DIFFERENTIAL AMPLIFIER WITH COMMON-MODE BIASING TECHNIQUE

TECHNICAL FIELD

Certain aspects of the present disclosure generally relate to electronic circuits and, more particularly, to a differential amplifier circuit.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more power amplifiers (PAs) to amplify signals for transmission. In some cases, the PAs may be implemented using one or more differential amplifiers.

SUMMARY

Certain aspects of the present disclosure generally relate to an amplification circuit and techniques for improving a common-mode rejection ratio (CMRR) of the amplification circuit.

Certain aspects of the present disclosure provide an amplification circuit. The amplification circuit generally includes a differential amplifier and an auxiliary amplifier. The differential amplifier generally includes a first pair of transistors and a second pair of transistors coupled to the first pair of transistors, wherein gates of the first pair of transistors are coupled to respective differential input nodes of the amplification circuit, wherein a drain of one of the first pair of transistors is coupled to a drain of one of the second pair of transistors, and wherein a drain of another one of the first pair of transistors is coupled to a drain of another one of the second pair of transistors. The auxiliary amplifier generally includes a third pair of transistors corresponding to the first pair of transistors and a fourth pair of transistors corresponding to the second pair of transistors, wherein drains of the third and fourth pairs of transistors are coupled together and to gates of the second pair of transistors and wherein gates of the fourth pair of transistors are coupled together.

Certain aspects of the present disclosure provide an amplification circuit. The amplification circuit generally includes a differential amplifier including a first transistor and a second transistor, as well as a third transistor and a fourth transistor having drains coupled to drains of the first transistor and the second transistor, respectively. In certain aspects, the amplification circuit also includes an auxiliary amplifier including a fifth transistor and a sixth transistor, as well as a seventh transistor and an eighth transistor, wherein gates and drains of the seventh transistor and the eighth transistor are coupled together and to gates of the third transistor and the fourth transistor and wherein the gates and the drains of the seventh transistor and the eighth transistor are coupled to drains of the fifth transistor and the sixth transistor.

Certain aspects of the present disclosure provide a method for signal processing. The method generally includes amplifying an input signal with a differential amplifier, generating a biasing signal that is inversely proportional to a common-mode (CM) component of the input signal, and biasing the differential amplifier with the biasing signal.

Certain aspects of the present disclosure provide an apparatus for signal processing. The apparatus generally includes means for amplifying an input signal, means for generating a biasing signal that is inversely proportional to a CM component of the input signal, and means for biasing the means for amplifying via the biasing signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
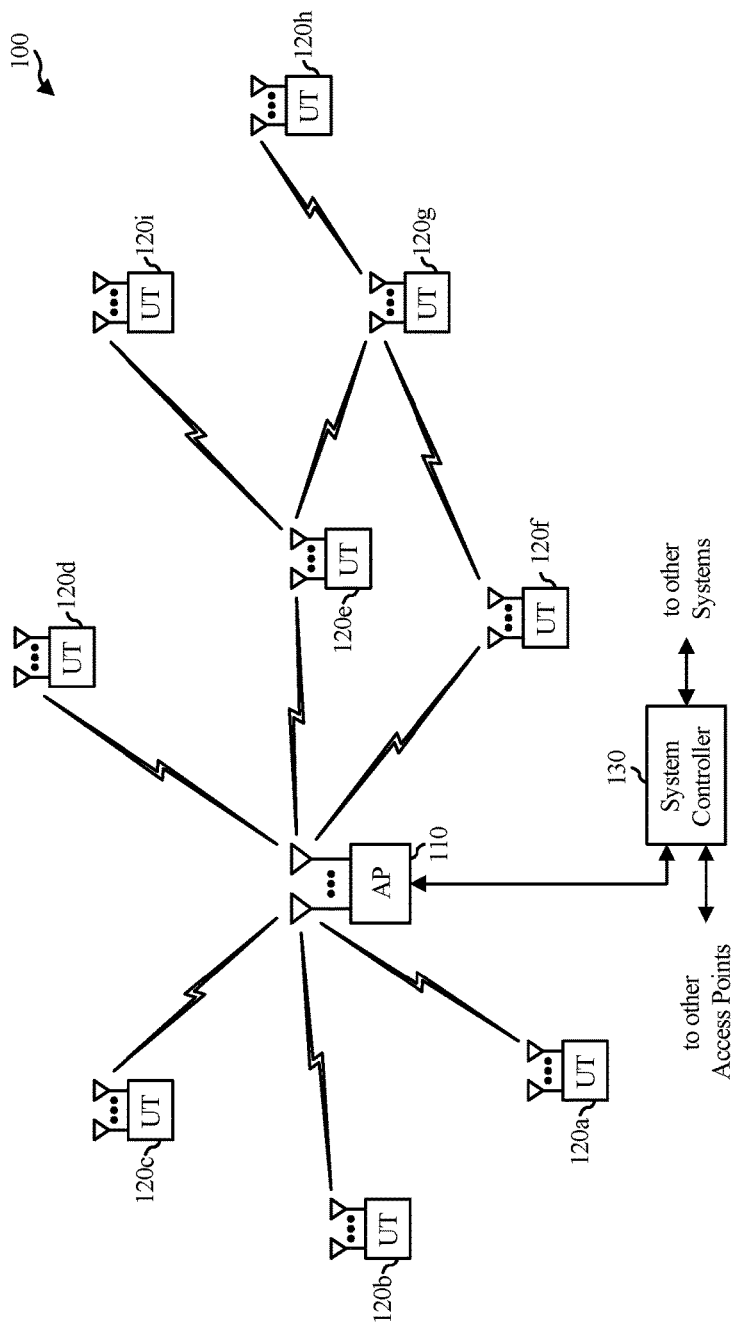
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include at least one differential amplifier, as described in more detail herein.

Figure 2:
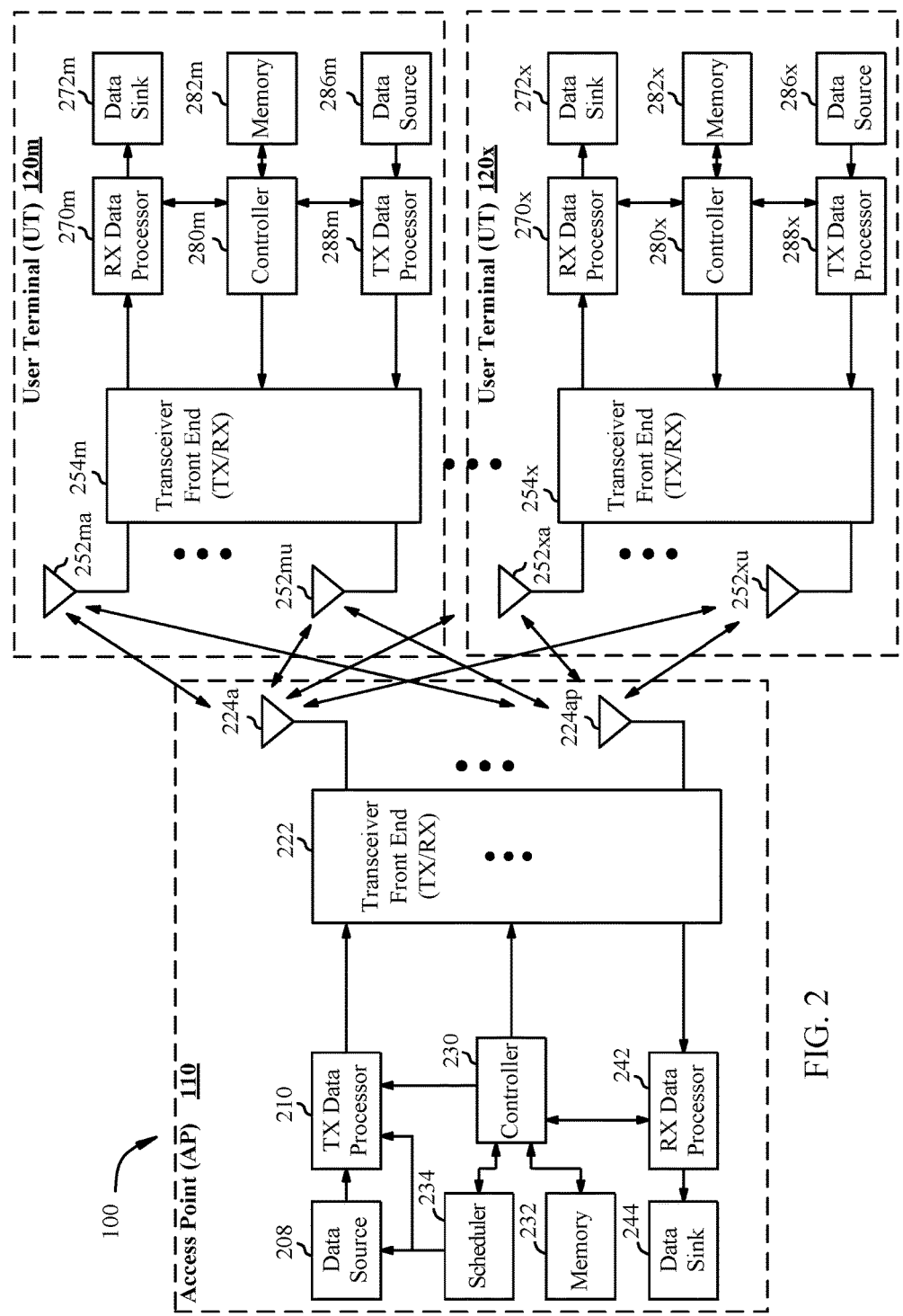
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a differential amplifier as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
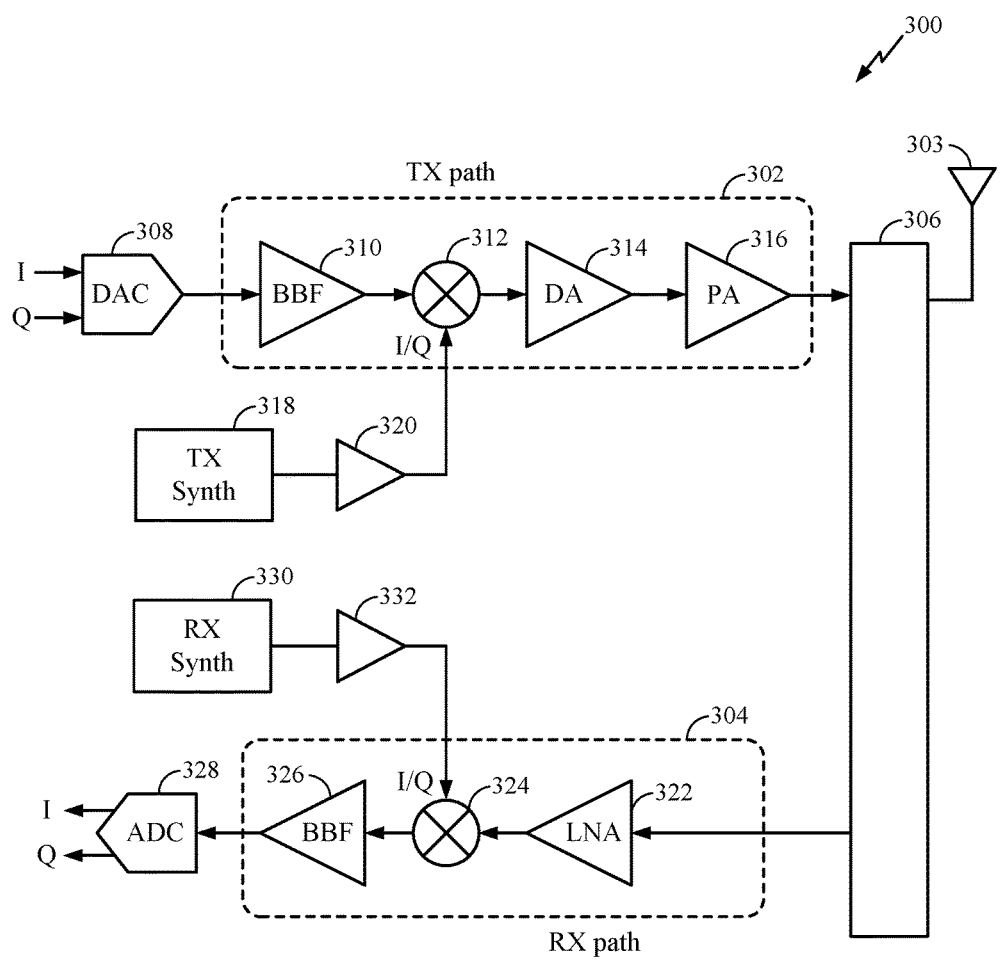
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. In some aspects of the present disclosure, the BBF 310 may include a tunable active filter as described below. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include a tunable active filter as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. In certain aspects of the present disclosure, the PA 316 and/or LNA 322 may be implemented using a differential amplifier, as described in more detail herein.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects provided herein can be applied to amplify signals in any of various other suitable systems. For example, the amplification circuit described herein can be used to amplify signals in audio amplifiers or voltage meters, to name a few.

Example Amplification Circuit

The common-mode rejection ratio (CMRR) of a differential amplifier generally refers to the amplifier's ability to suppress common-mode (CM) signals. A CM signal is a signal that appears simultaneously and in-phase on both of the differential inputs of the differential amplifier. For example, electromagnetic interference (EMI) may cause a magnetic coupling of a CM signal at the input of the differential amplifier. This may be a problem if the CM signal has significant power as compared to the differential signal that is to be amplified, and if the CMRR of the amplifier is not high enough to sufficiently suppress the CM signal. In such cases, the CM signal may cause distortion at the output of the amplifier. Simple operational transconductance amplifiers (OTAs) and operational amplifiers (op amps) often suffer from low CMRR.

Certain aspects of the present disclosure are generally directed to amplification circuits with increased CMRR. For example, certain aspects of the present disclosure provide a CM cancellation technique that improves overall CMRR of the amplification circuit using an auxiliary amplifier.

Figures 4A, 4B:
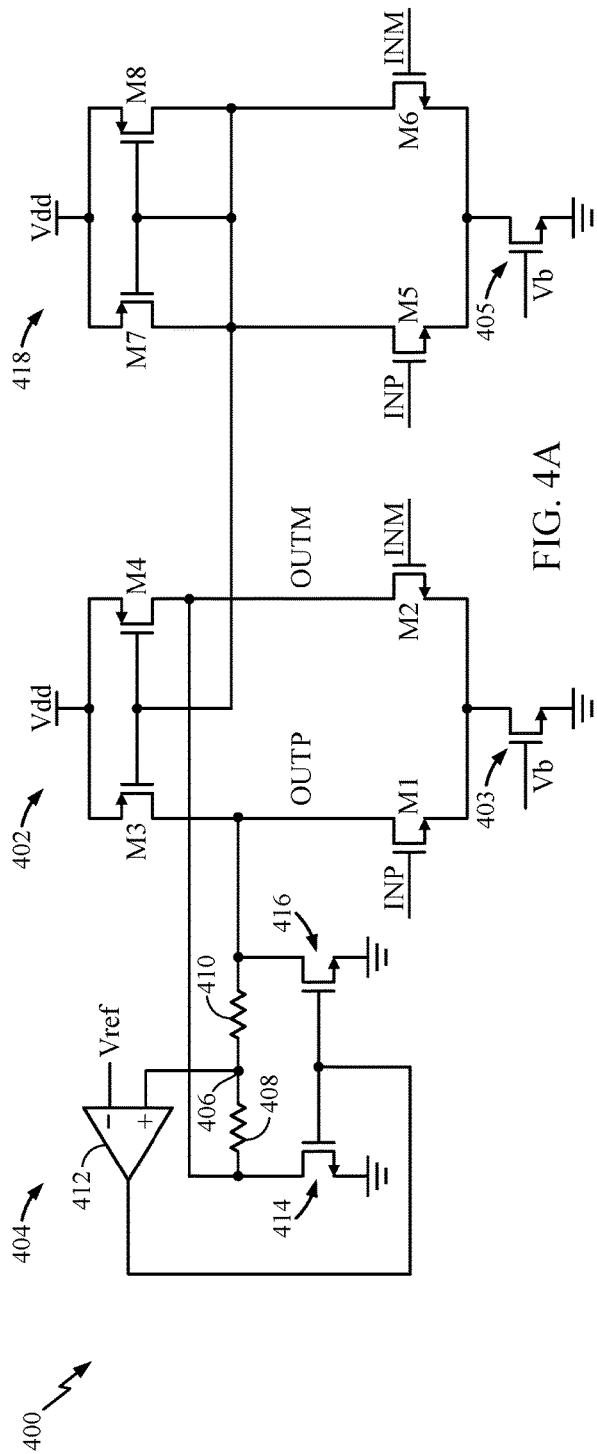
FIG. 4A is a schematic diagram of an example amplification circuit, in accordance with certain aspects of the present disclosure.
FIG. 4B is mathematical expression representing the common-mode gain of an example amplification circuit, in accordance with certain aspects of the present disclosure

FIG. 4A illustrates an example amplification circuit 400, in accordance with certain aspects of the present disclosure. The amplification circuit 400 includes a differential amplifier 402, which may include a first pair of transistors M1 and M2 and a second pair of transistors M3 and M4. The sources of transistors M3 and M4 may be coupled to a voltage rail Vdd. The sources of transistors M1 and M2 may be coupled together and to a current source (e.g., implemented by transistor 403) to bias the differential amplifier 402 by sinking a bias current from the sources of transistors M1 and M2 to a reference potential (e.g., electric ground). The gates of the first pair of transistors M1 and M2 may be coupled to differential input nodes INP and INM to receive a differential input signal to be amplified. The amplified differential input signal may be provided to a load at the differential output nodes OUTP and OUTM of the differential amplifier 402.

In certain aspects, the differential amplifier 402 may be coupled to a common-mode feedback (CMFB) circuit 404 configured to sense the CM voltage of the differential amplifier at node 406. For example, the CMFB circuit 404 may include resistive elements 408 and 410. As illustrated, resistive element 408 is coupled between node 406 and the output node OUTM, and the resistive element 410 is coupled between node 406 and the output node OUTP. The resistive elements 408 and 410 may have the same resistance such that the CM voltage (Vcm) at node 406 is equal to:

$$Vcm = \frac{Vop + Vom}{2}$$

where Vop is the voltage at output node OUTP and Vom is the voltage at output node OUTM. In certain aspects, the CMFB circuit 404 also includes an amplifier 412 configured to compare the Vcm at node 406 with a reference voltage Vref (e.g., set based on a desired Vcm for the differential amplifier 402) and control an amount of current sunk from the output nodes OUTP and OUTM based on the comparison in an effort to adjust the actual Vcm. For example, the output of the amplifier 412 may be coupled to gates of transistors 414 and 416 having drains coupled to the output nodes OUTM and OUTP, respectively. Thus, as the Vcm at node 406 increases above Vref, the voltage at the output of the amplifier 412 increases to increase the amount of current sunk from output nodes OUTP and OUTM by transistors 414 and 416, effectively decreasing the Vcm of the differential amplifier 402.

Certain aspects of the present disclosure provide a CM cancellation technique that increases the overall CMRR of the amplification circuit 400. For example, the differential amplifier 402 may be coupled to an auxiliary amplifier 418 having a pair of transistors M5 and M6 corresponding to the pair of transistors M1 and M2, and having a pair of transistors M7 and M8 corresponding to the pair of transistors M3 and M4. In other words, the transistors M5 and M6 may replicate (e.g., use the same process technology and have the same dimensions) or be scaled versions of the transistor pair M1 and M2, and the transistor pair M7 and M8 may replicate or be scaled versions of the transistor pair M3 and M4. For example, the transistors M5 and M6 may be one-tenth the size of transistors M1 and M2, and the transistors M7 and M8 may be one-tenth the size of transistors M3 and M4.

In certain aspects, the auxiliary amplifier 418 also includes a current source (e.g., transistor 405) to bias the auxiliary amplifier 418 by sinking a bias current from the sources of transistors M5 and M6. For example, the bias current sunk by transistor 405 may be a tenth of the bias current sunk by transistor 403 when the scaling of the transistors of the auxiliary amplifier 418 is 1:10 as described above. While a scaling ratio of 1:10 is provided as an example to facilitate understanding, any suitable scaling ratio may be used. The scaling of the transistors of the auxiliary amplifier 418 impacts the power consumption of the auxiliary amplifier. For example, if a 1:5 scaling is used, the bias current sunk by transistor 405 may be a fifth of the bias current sunk by transistor 403. In certain aspects, the gates of transistors M5 and M6 may be coupled to the differential input nodes INP and INM, and the gates and drains of the transistors M7 and M8 may be coupled together and to the drains of transistors M5 and M6, as illustrated. The drains of transistors M7 and M8 are coupled to the gate of transistors M3 and M4 to bias the transistors M3 and M4.

The auxiliary amplifier 418 may have a CM gain that is a scaled version of the CM gain of the differential amplifier 402 and may generate a scaled version of the CM currents flowing through transistors M1 and M2 of the differential amplifier 402. The CM currents generated by the auxiliary amplifier 418 may be replicated through transistors M3 and M4. The CM currents flowing through transistors M3 and M4 may be nearly the same as the CM currents flowing through transistors M1 and M2, thus preventing the CM current from flowing from the output nodes OUTP and OUTM to other circuitry (e.g., a load) connected to the output nodes.

FIG. 4B is a mathematical expression 420 representing the CM gain of the amplification circuit 400 where a 1:10 scale ratio is used for the transistors in the auxiliary amplifier 418, in accordance with certain aspects of the present disclosure. In expression 420, $g_{m1}$ is the transconductance of the transistor M1, $g_{m3}$ is the transconductance of the transistor M3, $g_{m5}$ is the transconductance of the transistor M5, $g_{m7}$ is the transconductance of transistor M7, $R_{ss}$ is the drain-to-source resistance of the transistor 403, $R_{out}$ is the load resistance of the amplification circuit 400 (and more particularly, of the differential amplifier 402), and $A_{CMFB\_loop}$ is the loop gain of the CMFB circuit 404. As illustrated, the CM gain contribution of the auxiliary amplifier 418 counteracts the CM gain contribution by the differential amplifier 402, reducing the CM gain, and in turn, improving the CMRR of the amplification circuit 400. The amplification circuit 400 reduces the CM gain with little to no impact on the differential gain of the amplification circuit 400, as described in more detail with respect to FIGS. 5 and 6.

Figure 5:
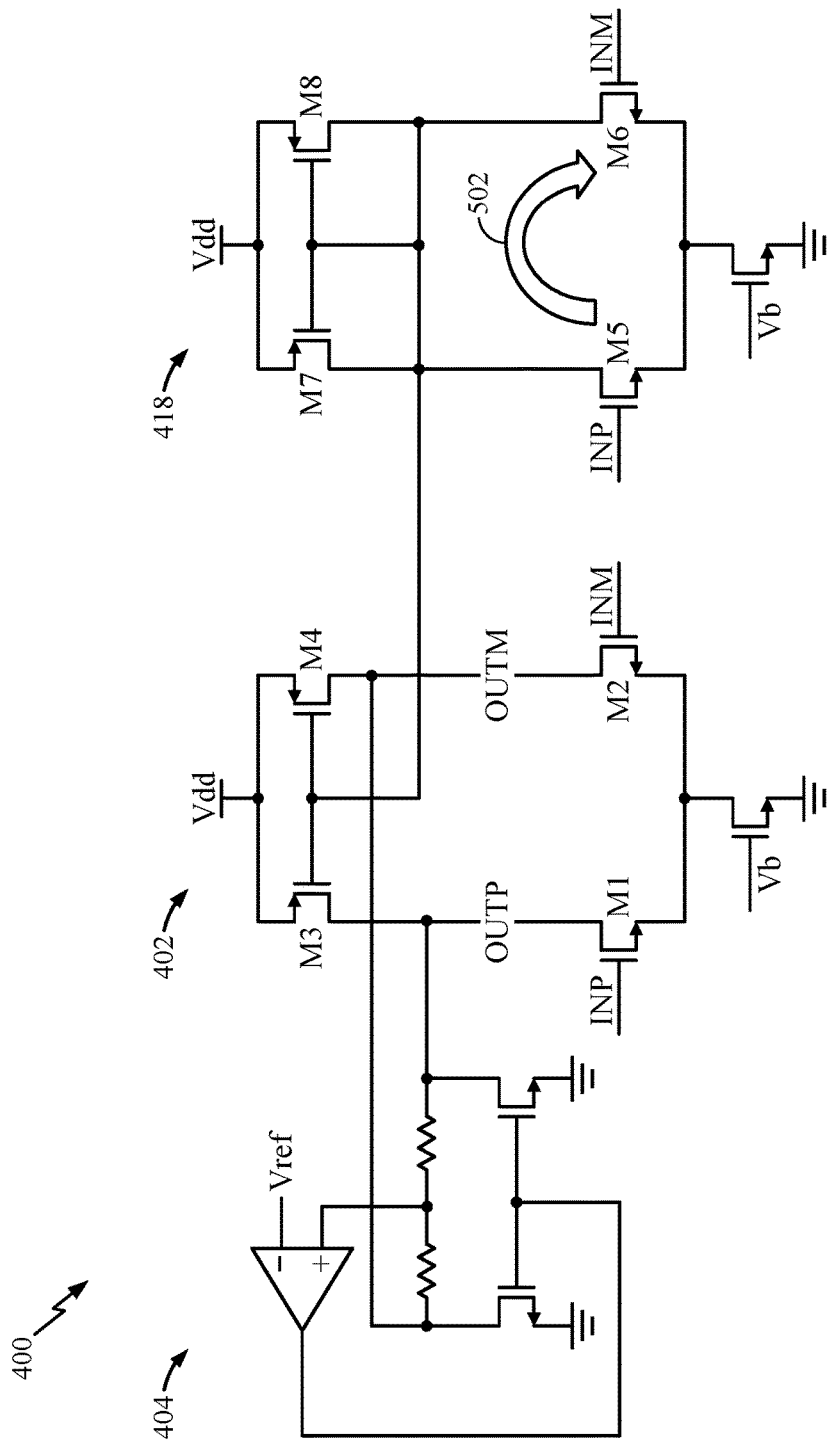
FIG. 5 illustrates the example amplification circuit of FIG. 4A in a differential mode of operation, in accordance with certain aspects of the present disclosure.

FIG. 5 illustrates the amplification circuit 400 in a differential mode of operation, in accordance with certain aspects of the present disclosure. Since the gates of transistors M7 and M8 are coupled to the gates of transistors M3 and M4, the source-to-drain currents of transistors M3 and M4 may be the same as, or a scaled version of, the source-to-drain currents of transistors M7 and M8. Moreover, since the gates and drains of transistors M7 and M8 are all coupled together and the sources of transistors M7 and M8 are coupled together and to the same voltage rail Vdd, the drain-to-source currents of transistors M7 and M8 will be equal. Since the drains of transistors M5 and M6 are coupled together, when different signals are applied to the gates of transistors M5 and M6, the resultant differential mode current 502 has little to no impact on the source-to-drain currents of transistors M7 and M8. In other words, when the voltage at the gate of transistor M5 increases and the voltage at the gate of transistor M6 decreases, in response to a differential signal, the drain-to-source current of transistor M5 may increase, and the drain-to-source current of transistor M6 may decrease, counteracting each other such that the differential mode current 502 does not flow through the transistors M7 and M8. Therefore, since the differential signal has little to no impact on the source-to-drain current of transistors M7 and M8, the auxiliary amplifier 418 will have little to no impact on the source-to-drain currents of transistors M3 and M4 in response to the differential signal. Thus, the auxiliary amplifier 418 will have little to no impact on the differential mode operation of the differential amplifier 402.

Figure 6:
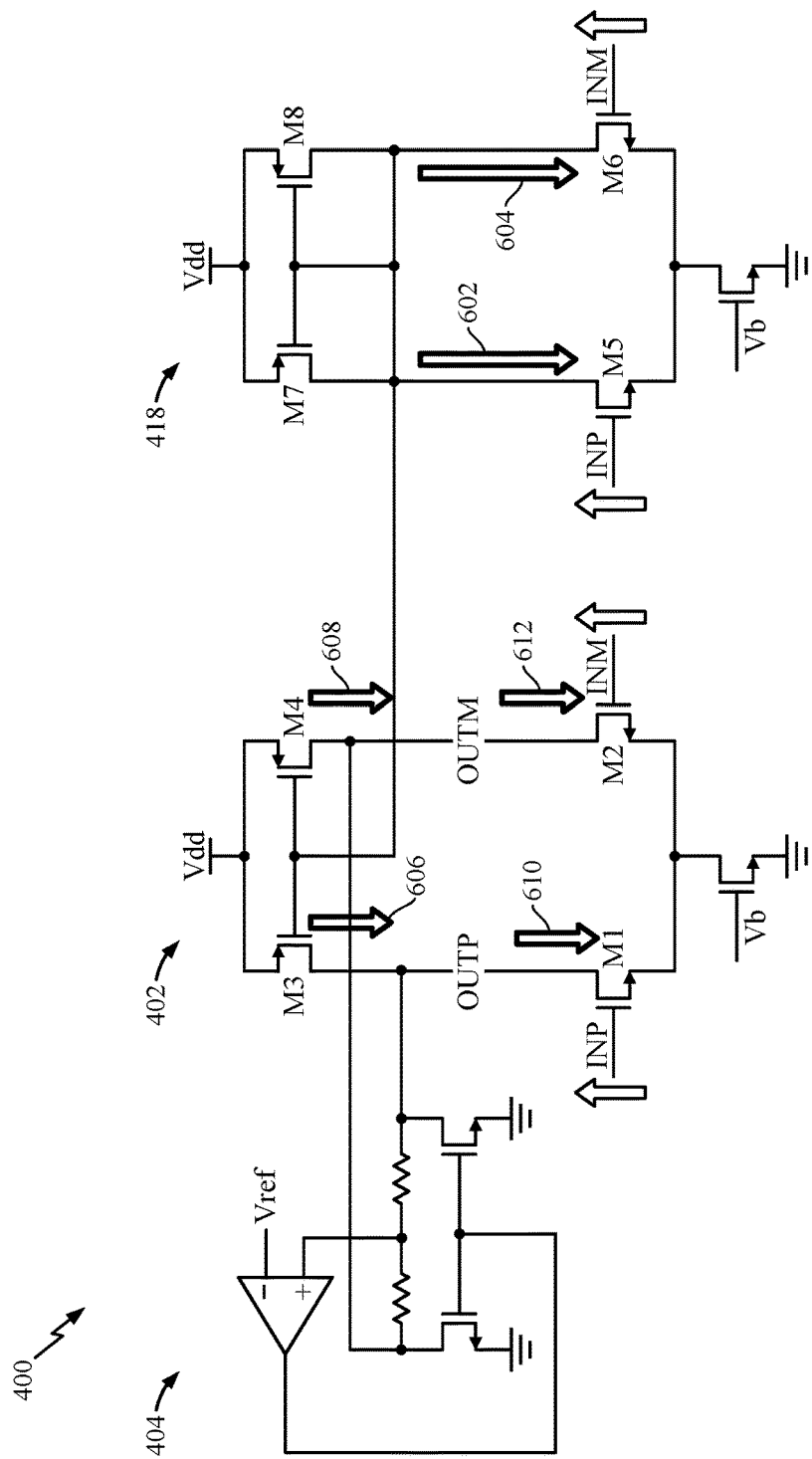
FIG. 6 illustrates the example amplification circuit of FIG. 4A receiving a common-mode (CM) signal, in accordance with certain aspects of the present disclosure.

FIG. 6 illustrates the amplification circuit 400 receiving a CM signal, in accordance with certain aspects of the present disclosure. For example, in response to a CM signal, the voltages at the gates of transistors M1, M2, M5, and M6 may increase simultaneously, generating CM currents 602 and 604 in the auxiliary amplifier 418 and CM currents 610 and 612 in the differential amplifier 402, as illustrated. The CM currents 602 and 604 also flow from the sources to the drains of transistors M7 and M8, respectively. The auxiliary amplifier 418 biases the transistors M3 and M4 such that the CM currents 606 and 608 through transistors M3 and M4 are the same as (or a scaled version of) the CM currents 602 and 604, respectively. In other words, the auxiliary amplifier 418 is configured to bias the transistors M3 and M4 in a manner that generates CM currents 606 and 608 that are the same (or about the same) as the CM currents 610 and 612, respectively. Therefore, the CM currents 606 and 608 effectively counteract the CM currents 610 and 612, preventing the CM currents from flowing to a load that may be coupled to the output nodes OUTP and OUTM.

Figure 7:
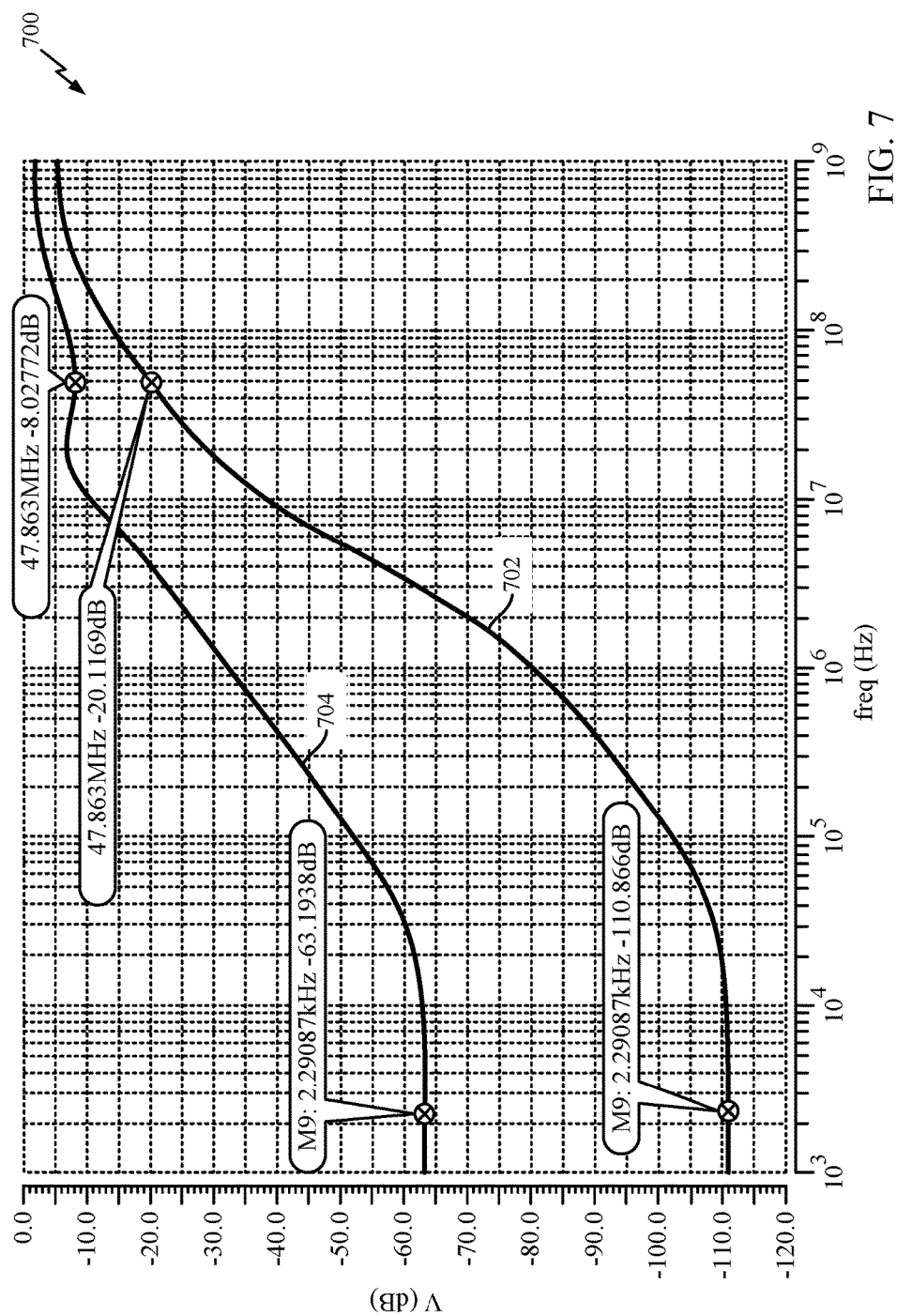
FIG. 7 is a semilogarithmic graph illustrating the common-mode rejection ratio (CMRR) of an example amplification circuit with frequency, in accordance with certain aspects of the present disclosure.

FIG. 7 is a semilogarithmic graph 700 illustrating the CMRR of the amplification circuit 400 represented by curve 702, in accordance with certain aspects of the present disclosure. As illustrated, at direct current (DC) (or low frequency), the CMRR of the amplification circuit 400 may be improved by over 40 dB as compared to the CMRR of an amplification circuit implemented without the auxiliary amplifier 418 represented by curve 704. Moreover, at about 47 MHz, the CMRR of the amplification circuit 400 may be improved by about 12 dB as compared to the CMRR of an amplification circuit implemented without the auxiliary amplifier 418.

Figure 8:
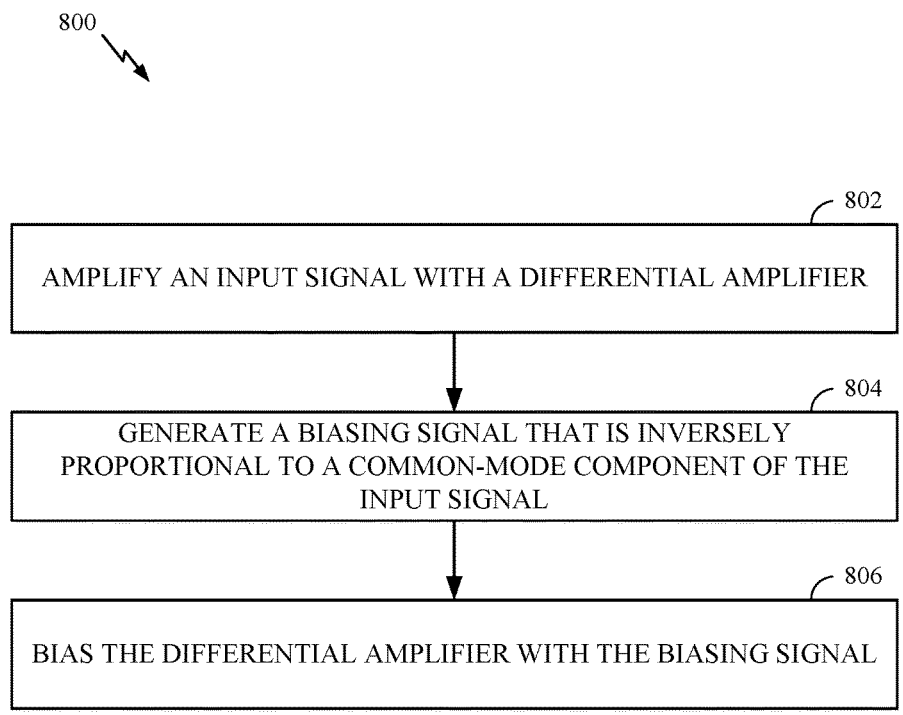
FIG. 8 is a flow diagram illustrating example operations for signal processing, in accordance with certain aspects of the present disclosure.

FIG. 8 is a flow diagram illustrating example operations 800 for signal processing, in accordance with certain aspects of the present disclosure. The operations 800 may be performed by a circuit, such as the amplification circuit 400 of FIG. 4.

The operations 800 may begin, at block 802, by amplifying an input signal with a differential amplifier (e.g., the differential amplifier 402). At block 804, the circuit may generate a biasing signal that is inversely proportional to a CM component of the input signal. At block 806, the differential amplifier may be biased with the biasing signal.

The operations 800 may also include generating a first CM current (e.g., CM current 606 or 608) sourced to an output node (e.g., output node OUTP or OUTM) of the differential amplifier based on the biasing signal, and generating a second CM current (e.g., CM current 610 or 612) sunk from the output node based on the CM component of the input signal. In certain aspects, a magnitude of the first CM current may be the same as a magnitude of the second CM current.

In certain aspects, the operations 800 may also include generating a first biasing current to bias the differential amplifier, and generating a second biasing current, the biasing signal being generated based on the second biasing current. In this case, the second biasing current may be a scaled version of the first biasing current.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. For example, means for amplifying and/or means for generating a CM current may comprise a differential amplifier, such as the differential amplifier 402. Means for generating a biasing signal and/or means for biasing may comprise an auxiliary amplifier, such as the auxiliary amplifier 418. Means for generating a biasing current may comprise a current source (or sink), which may be implemented by a transistor, such as the transistor 403 or 405.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An amplification circuit comprising:
   a differential amplifier comprising a first pair of transistors and a second pair of transistors coupled to the first pair of transistors, wherein gates of the first pair of transistors are coupled respectively to two different input nodes of the amplification circuit, wherein a drain of one of the first pair of transistors is coupled to a drain of one of the second pair of transistors, and wherein a drain of another one of the first pair of transistors is coupled to a drain of another one of the second pair of transistors; and
an auxiliary amplifier comprising a third pair of transistors corresponding to the first pair of transistors and a fourth pair of transistors corresponding to the second pair of transistors, wherein each of the two drains of the third pair of transistors is coupled to both of the two drains of the fourth pair of transistors drains of the third and fourth pairs of transistors are coupled together and to gates of the second pair of transistors, and wherein gates of the fourth pair of transistors are coupled together.

2. The amplification circuit of claim 1, wherein the gates of the second pair of transistors are coupled together, and wherein the two gates of the fourth pair of transistors are both coupled to the drains of the third pair of transistors and the drains of the fourth pairs of transistors.

3. The amplification circuit of claim 1, further comprising:
a first current source coupled to the first pair of transistors; and
a second current source coupled to the third pair of transistors.

4. The amplification circuit of claim 3, wherein:
the first current source is configured to sink a first current from sources of the first pair of transistors to a reference potential; and
the second current source is configured to sink a second current from sources of the third pair of transistors to the reference potential.

5. The amplification circuit of claim 4, wherein the second current is less than the first current.

6. The amplification circuit of claim 4, wherein:
sizes of the first pair of transistors and the second pair of transistors are scaled versions of sizes of the third pair of transistors and the fourth pair of transistors, respectively, by a ratio; and
the second current is a fraction of the first current by the same ratio.

7. The amplification circuit of claim 6, wherein the ratio is ten to one.

8. The amplification circuit of claim 1, wherein gates of the third pair of transistors are coupled respectively to the two different input nodes of the amplification circuit.

9. The amplification circuit of claim 1, wherein sources of the second pair of transistors and the fourth pair of transistors are coupled to a voltage rail.

10. An amplification circuit comprising:
a differential amplifier comprising:
a first transistor and a second transistor; and
a third transistor and a fourth transistor having drains coupled to drains of the first transistor and the second transistor, respectively; and
an auxiliary amplifier comprising:
a fifth transistor and a sixth transistor; and
a seventh transistor and an eighth transistor, wherein gates and drains of the seventh transistor and the eighth transistor are coupled together and to gates of the third transistor and the fourth transistor, wherein each of the gates and the drains of the seventh transistor and the eighth transistor are coupled to drains of the fifth transistor and the sixth transistor.

11. The amplification circuit of claim 10, wherein gates of the first transistor and the second transistor are coupled respectively to two different input nodes of the amplification circuit, and wherein gates of the fifth transistor and the sixth transistor are coupled respectively to the two different input nodes of the amplification circuit.

12. The amplification circuit of claim 10, wherein a source of the first transistor is coupled to a source of the second transistor, and wherein a source of the fifth transistor is coupled to a source of the sixth transistor, the amplification circuit further comprising:
a first current source configured to sink a first current from the sources of the first transistor and the second transistor to a reference potential; and
a second current source configured to sink a second current from the sources of the fifth transistor and the sixth transistor to the reference potential.

13. The amplification circuit of claim 12, wherein the second current is less than the first current.

14. The amplification circuit of claim 12, wherein:
sizes of the first transistor, the second transistor, the third transistor, and the fourth transistor are scaled versions of sizes of the fifth transistor, the sixth transistor, the seventh transistor, and the eighth transistor, respectively, by a ratio; and
the second current is a fraction of the first current by the same ratio.

15. The amplification circuit of claim 14, wherein the first transistor, the second transistor, the third transistor, and the fourth transistor are larger than the fifth transistor, the sixth transistor, the seventh transistor, and the eighth transistor, respectively.

16. The amplification circuit of claim 10, further comprising:
a common-mode feedback (CMFB) circuit coupled to outputs of the amplification circuit, wherein the outputs of the amplification circuit are coupled to the drains of the third transistor and the fourth transistor.

17. The amplification circuit of claim 16, wherein the CMFB circuit comprises:
a first resistive element and a second resistive element;
a ninth transistor and a tenth transistor coupled to the first resistive element and the second resistive element, respectively, wherein the drains of the third transistor and the fourth transistor are coupled to the ninth transistor and the tenth transistor, respectively; and
an amplifier having:
a first input coupled to a node coupled between the first resistive element and the second resistive element;
a second input coupled to a reference voltage source; and
an output coupled to gates of the ninth transistor and the tenth transistor.

18. The amplification circuit of claim 17, wherein sources of the ninth transistor and the tenth transistor are coupled to a reference potential node.

19. The amplification circuit of claim 1, wherein a first input node of the two different input nodes is configured to receive a first input signal and a second input node of the two different input nodes is configured to receive a second input signal different from the first input signal, the first and second input signals together forming a differential input signal and wherein the differential amplifier comprises two different output nodes, a first output node of the two different output nodes is configured to produce a first output signal and a second output node of the two different output nodes is configured to produce a second output signal different from the first output signal, the first and second output signals together forming a differential output signal.

20. The amplification circuit of claim 10, wherein a first input node of the two different input nodes is configured to receive a first input signal and a second input node of the two different input nodes is configured to receive a second input signal different from the first input signal, the first and second input signals together forming a differential input signal and wherein the differential amplifier comprises two different output nodes, a first output node of the two different output nodes is configured to produce a first output signal and a second output node of the two different output nodes is configured to produce a second output signal different from the first output signal, the first and second output signals together forming a differential output signal.

* * * * *